(12) United States Patent
Lee et al.

(10) Patent No.: US 8,940,553 B2
(45) Date of Patent: Jan. 27, 2015

(54) FLAT PANEL DISPLAY DEVICE AND METHOD FOR MANUFACTURING FLAT PANEL DISPLAY

(71) Applicant: Samsung Display Co., Ltd., Yongin, Gyeonggi-Do (KR)

(72) Inventors: Gwang-Geun Lee, Yongin (KR); Jong-Hyun Park, Yongin (KR); Seong-Kweon Heo, Yongin (KR); Chun-Gi You, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/023,242

(22) Filed: Sep. 10, 2013

(65) Prior Publication Data
US 2014/0353666 A1 Dec. 4, 2014

(30) Foreign Application Priority Data
May 30, 2013 (KR) .......................... 10-2013-0062111

(51) Int. Cl.
*H01L 21/00* (2006.01)
*H01L 23/58* (2006.01)
*G01R 31/26* (2014.01)

(52) U.S. Cl.
USPC .............................................. 438/12; 257/48

(58) Field of Classification Search
USPC ...................... 438/5, 10–18; 257/48
See application file for complete search history.

(56) References Cited

U.S. PATENT DOCUMENTS

| 6,063,640 | A | * | 5/2000 | Mizukoshi et al. | ............. | 438/15 |
| 7,724,019 | B2 | * | 5/2010 | Chang et al. | ............. | 324/750.01 |
| 2013/0307548 | A1 | * | 11/2013 | Lee et al. | ...................... | 324/414 |

FOREIGN PATENT DOCUMENTS

| KR | 1020060000853 | 1/2006 |
| KR | 1020060016590 | 2/2006 |
| KR | 1020120061511 | 6/2012 |

* cited by examiner

*Primary Examiner* — Calvin Lee
(74) *Attorney, Agent, or Firm* — Innovation Counsel LLP (57) ABSTRACT

A flat panel display device includes a pixel circuit provided on a substrate, a pixel wiring, an inspection pad connected to the pixel circuit through the pixel wiring, a main wiring separated from the inspection pad by a gap, and a common electrode covering substantially the entire substrate and electrically connecting the inspection pad to the main wiring.

18 Claims, 6 Drawing Sheets

FLAT PANEL DISPLAY DEVICE AND METHOD FOR MANUFACTURING FLAT PANEL DISPLAY

CROSS-REFERENCE TO RELATED PATENT APPLICATION

This application claims the benefit of Korean Patent Application No. 10-2013-0062111, filed on May 30, 2013, in the Korean Intellectual Property Office, the disclosure of which is incorporated herein in its entirety by reference.

BACKGROUND OF THE INVENTION

1. Field of the Invention

The present invention relates to a flat panel display device and a method for manufacturing the flat panel display device.

2. Description of the Related Art

Flat panel display devices are used in computer monitors, televisions, and cellular phone terminals. Liquid crystal display (LCD) devices, plasma display panel (PDP) devices, and organic light emitting display (OLED) apparatuses are examples of flat panel display devices.

A flat panel display device generally includes a substrate that includes a display area for displaying images and a non-display area. The non-display area is a peripheral area that surrounds the display area. The display area includes a plurality of pixels. The pixels may receive electric signals through various wirings (e.g., a main wiring and a pixel wiring) connected thereto. It is typically necessary to check whether open or short defects exist in the wirings (e.g., the pixel wiring) when the flat panel display device is manufactured. For this purpose, an inspection signal having a certain waveform is applied to an inspection pad connected to the wirings, and whether the waveform of an output signal is normal indicates the quality of the wirings.

In general, an inspection pad is directly connected to a main wiring of the flat panel display device. This configuration may distort the inspection signal and may cause an error in the inspection result.

SUMMARY OF THE INVENTION

An embodiment of the present invention may be related a flat panel display device including wirings and an inspection pad for inspecting defects in the wirings. An embodiment of the invention may be related to a method for manufacturing the flat panel display device.

An embodiment of the present invention may be related to a flat panel display device. The flat panel display device includes a pixel circuit provided on a substrate, a pixel wiring, an inspection pad connected to the pixel circuit through the pixel wiring, a main wiring separated from the inspection pad by a substantial gap (which may be wider than a thickness of at least a layer of the display device), and a common electrode covering substantially the entire substrate and electrically connecting the inspection pad to the main wiring.

The flat panel display device may further include a first bridge portion protruding from a side of the main wiring that faces the inspection pad and a second bridge portion protruding from a side of the inspection pad that faces the main wiring. The common electrode may electrically connect the first bridge portion to the second bridge portion.

The flat panel display device may further include an insulating layer that covers the inspection pad and the main wiring. The insulating layer may have an opening that exposes the first bridge portion and the second bride portion.

The common electrode may be provided on the insulating layer and may be in direct contact with each of the first bridge portion and the second bridge portion exposed through the opening.

The main wiring may extend in a first direction, and the pixel wiring may extend in a second direction that is different from and/or is substantially perpendicular to the first direction.

The substrate may include a first edge and a second edge substantially parallel to the first edge. The main wiring may include a first main wiring arranged at the first edge and may include a second main wiring arranged at the second edge. The pixel wiring may be electrically connected to both the first main wiring and the second main wiring.

The pixel wiring may be electrically connected to the first main wiring through the common electrode and is directly connected to the second main wiring.

The flat panel display device may further include a gate wiring provided on the substrate and a lower insulating layer covering the gate wiring. The main wiring and the inspection pad may be formed on the lower insulating layer.

The main wiring may apply an initialization voltage to the pixel circuit.

The pixel circuit may include a capacitor, and the pixel wiring may be connected to the capacitor.

An embodiment of the present invention may be related to a method for manufacturing a flat panel display device. The method includes forming a pixel circuit, a pixel wiring connected to the pixel circuit, an inspection pad connected to the pixel wiring, and a main wiring separated from the inspection pad by a gap, inspecting whether the pixel wiring is normal by applying an inspection signal to the inspection pad, and (after the inspecting) forming a common electrode covering the entire substrate (and/or covering at least two pixel electrodes of the flat panel device) and electrically connecting the inspection pad to the main wiring.

The forming of the inspection pad and the main wiring may include simultaneously forming a first bridge portion protruding from a side of the main wiring that faces the inspection pad and forming a second bridge portion protruding from a side of the inspection pad that faces the main wiring. In the forming of the common electrode, the common electrode may be electrically connected the first bridge portion to the second bridge portion.

The method may further include after the inspecting, forming an insulating layer that covers the inspection pad and the main wiring and forming an opening in the insulating layer to expose the first bridge portion and the second bridge portion.

In the forming of the common electrode, the common electrode may be provided on the insulating layer and may be in direct contact with the first bridge portion and the second bridge portion exposed through the opening.

The pixel wiring, the inspection pad, and the main wiring may be simultaneously formed.

An embodiment of the invention may be related to a display device that includes a pixel circuit included in a first pixel of the flat panel display device, a pixel wiring, an inspection pad electrically connected through the pixel wiring to the pixel circuit, a main wiring separated from the inspection pad by a gap, a first pixel electrode associated with the first pixel of the display device, a second pixel electrode associated with a second pixel of the display device, and a common electrode overlapping both the first pixel electrode the second pixel electrode and being electrically connected to both the inspection pad and the main wiring.

A portion of the common electrode may be disposed between the inspection pad and the main wiring.

The display device may further include a dielectric layer that directly contacts each of the inspection pad, the main wiring, and the common electrode.

BRIEF DESCRIPTION OF THE DRAWINGS

FIGS. 5A to 7B are schematic cross-sectional views illustrating a method for manufacturing the flat panel display device illustrated in FIG. 1 according to an embodiment of the present invention.

DETAILED DESCRIPTION OF THE INVENTION

As used herein, the term "and/or" may include any and all combinations of one or more of the listed items. Expressions such as "at least one of," when preceding a list of elements, modify the entire list of elements and do not modify the individual elements of the list.

Hereinafter, embodiments of the present invention are described in detail with reference to the attached drawings.

In the specification, to clearly describe the embodiments, some parts thereof may be omitted or briefly described. In the drawings, the thicknesses and widths of various layers and areas may be enlarged or exaggerated for clarity.

Throughout the specification, like reference numerals may designate like elements.

Although the terms first, second, etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer, or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms first, second, etc. may also be used herein to differentiate different categories of elements. For conciseness, the terms first, second, etc. may represent first-type (or first-category), second-type (or second-category), etc., respectively.

If a part (e.g., a layer, an area, or an element) is "above" or "on" another part, the part may be directly above or on the other part, or an intervening layer, area, or element may be interposed therebetween.

In the description, the term "connected" may mean "electrically connected".

Figure 1:
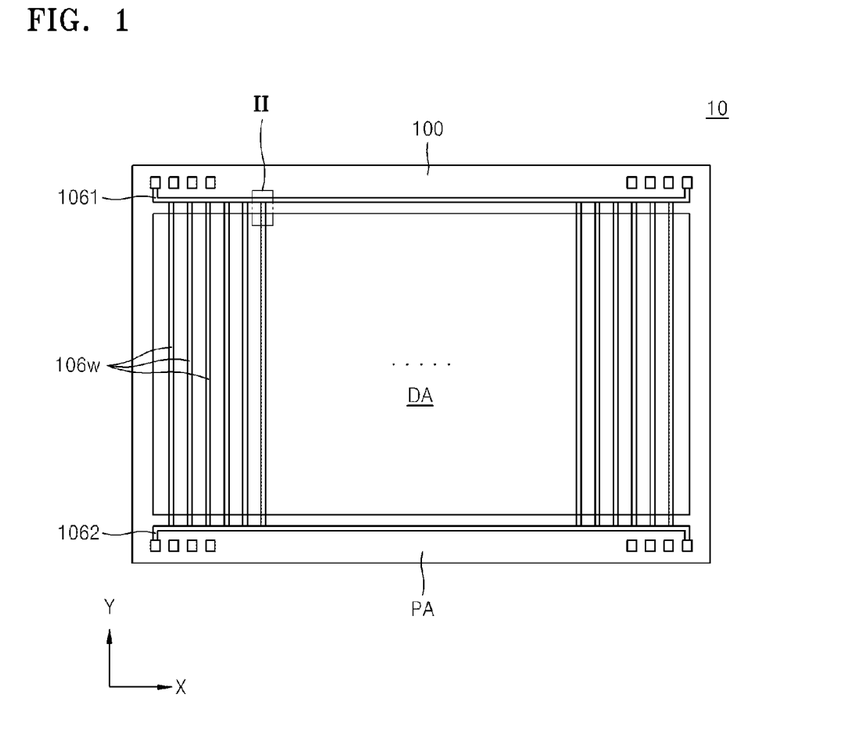
FIG. 1 is a schematic top view (or plan view) illustrating a flat panel display device according to an embodiment of the present invention.
Figure 2:
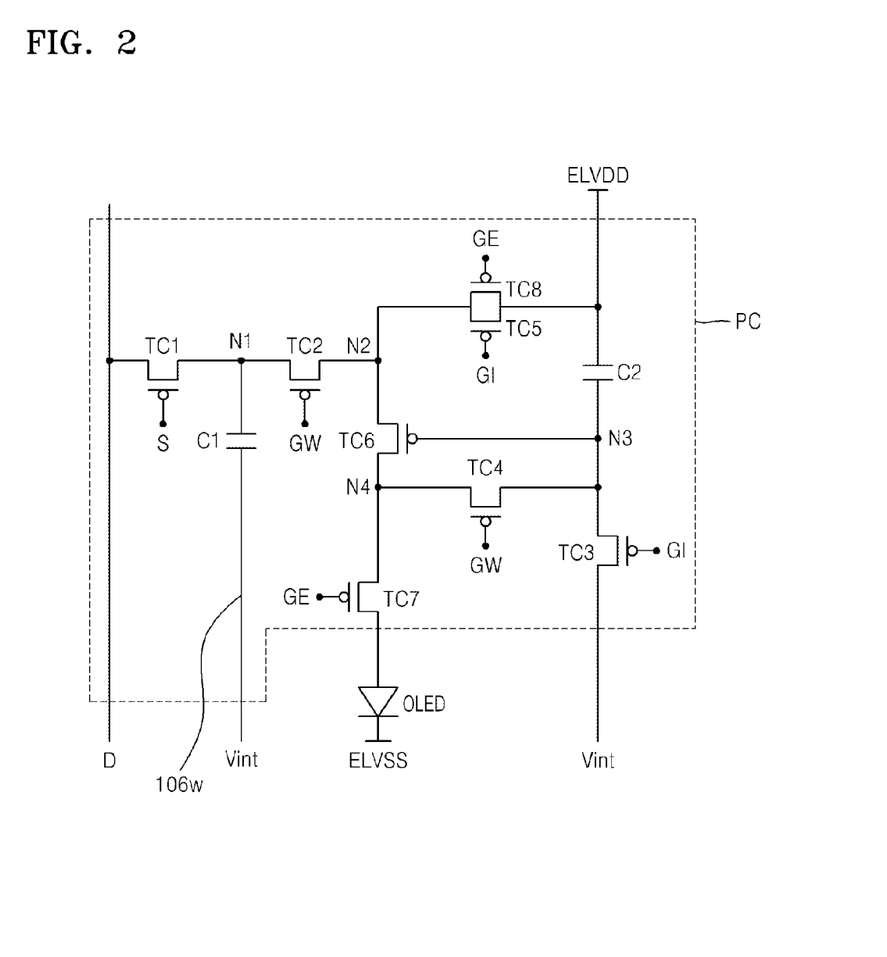
FIG. 2 is a circuit view illustrating a pixel of the panel display device illustrated in FIG. 1 according to an embodiment of the present invention.

FIG. 1 is a schematic top view (or plan view) illustrating a flat panel display device 10 according to an embodiment of the present invention. FIG. 2 is a circuit view illustrating a pixel of the panel display device 10 according to an embodiment of the present invention.

The flat panel display device 10 includes a substrate 100, which includes a display area DA and a peripheral area PA.

The display area DA is configured for displaying an image. The display area DA includes a plurality of pixel wirings 106w and a plurality of pixels that may receive signals from the pixel wirings 106w and may emit light. The peripheral area PA may substantially surround the display area DA. Various drivers for supplying signals to control the pixels, a main wiring for transferring the signals to the pixel wirings 106w, and various pads are arranged in the peripheral area PA.

Each of the pixels may include a display diode and a pixel circuit. In an embodiment, the flat panel display device 10 may be an organic light emitting display (OLED) apparatus. The pixel circuit may be a driving circuit for driving an OLED and may include at least two thin film transistors and at least one capacitor. In an embodiment, as shown in FIG. 2, the pixel circuit PC may include eight thin film transistors and two capacitors.

The pixel circuit is electrically connected to the pixel wiring 106w. The pixel wiring 106w extends in a Y-axis direction, and a column of the pixels arranged in the Y-axis direction is electrically connected to one of the pixel wirings 106w.

The pixel wiring 106w is electrically connected to the main wiring. The main wiring may transfer a signal to the pixel wiring 106w and may extend, for example, in an X-axis direction that is substantially perpendicular to the Y-axis direction. Referring to FIG. 1, the main wiring includes a first main wiring 1061 and a second main wiring 1062. The first main wiring 1061 is arranged along a first edge of the substrate 100, and the second main wiring 1062 is arranged along a second edge of the substrate 100 that may be substantially parallel to the first edge of the substrate 100. Both the first main wiring 1061 and the second main wiring 1062 may be electrically connected to the pixel wiring 106w. In an embodiment, the first main wiring 1061 is electrically connected to a top of the pixel wiring 106w and the second main wiring 1062 is electrically connected to a bottom of the pixel wiring 106w. The display area DA may be disposed between the first main wiring 1061 and the second main wiring 1062 in the top view (or plan view) the flat panel display device 10.

A plurality of the pixel wirings 106w may be arranged substantially parallel to each other and may be arranged along the X-axis direction. All of the pixel wirings 106w, which overlap the display area DA, may be electrically connected to the main wiring.

Referring to FIG. 1, the first main wiring 1061 and the second main wiring 1062 may transfer initialization signals (received from an initialization power source) to the pixel wiring 106w. Referring to FIG. 2, the pixel circuit PC includes first to eighth transistors, i.e., TC1, TC2, TC3, TC4, TC5, TC6, TC7, and TC8, a first capacitor C1, and a second capacitor C2. A first electrode of the third transistor TC3 may be connected to the pixel wiring 106w (for receiving an initialization voltage Vint), and a first electrode of the first capacitor C1 may be connected to the pixel wiring 106w (for receiving the initialization voltage Vint).

In an embodiment, in FIG. 2, a reference character S designates a scanning signal, a reference character D designates a data signal, a reference character N1 designates a first node, a reference character GW designates a first control signal, a reference character N2 designates a second node, a reference character N3 designates a third node, a reference character N4 designates a fourth node, a reference character ELVDD designates a first power voltage, a reference character GE designates a third control signal, and a reference character ELVSS designates a second power voltage.

In an embodiment, the third transistor TC3 may compensate for a threshold voltage Vth of the sixth transistor TC6, which is a driving transistor, together with the fourth transistor TC4. The first capacitor C1 may be charge with a voltage corresponding to a data signal D supplied through the first transistor TC1, which may turn on in response to a signal S. In general, it is preferable to uniformly apply substantially the same initialization voltage to pixel circuits PC of different pixels through the pixel wiring 106w.

If the pixel wiring 106w is electrically connected to only one of the first main wiring 1061 and the second main wiring 1062, such as the first main wiring 1061, the farther a pixel is separated from the first main 1061, the greater the effect of voltage drop in relation to a wiring length associated with the pixel. As a result, it may be difficult to apply the same initialization voltage to each pixel of the column of pixels that is connected to the same pixel wiring 106w. If the pixels in the display area DA do not receive substantially the same initialization voltage, a black margin may be substantially insufficient, a Mura defect may occur in a displayed image, and long range uniformity (LRU) may be substantially unsatisfactory.

According to an embodiment, the pixel wiring 106w is electrically connected to both the first main wiring 1061 and the second main wiring 1062 for substantially simultaneously applying initialization voltages to a top portion of the display area DA and a bottom portion of the display area DA. Accordingly, the initialization voltage may be substantially evenly applied to pixels in the entire display area DA. Advantageously, in an embodiment, a sufficient black margin may be provided, potential Mura defects in a displayed image may be substantially minimized or prevented, and the LRU may be satisfactory.

An inspection pad 106p (illustrated in FIG. 3) may be disposed at an end of the pixel wiring 106w. The inspection pad 106p may be arranged in the peripheral area PA. The inspection pad 106p is a pad for applying an inspection signal for detecting open and/or short defects of pixel circuits and/or wirings in a process of manufacturing the flat panel display device 10. For example, the inspection pad 106p may be arranged at an end of the pixel wiring 106w and may be electrically connected to the first main wiring 1061. In an embodiment, an inspection pad 106p may be arranged at an end of the pixel wiring 106w and may be electrically connected to the second main wiring 1062 instead of or in addition to the first main wiring 1061.

Figure 3:
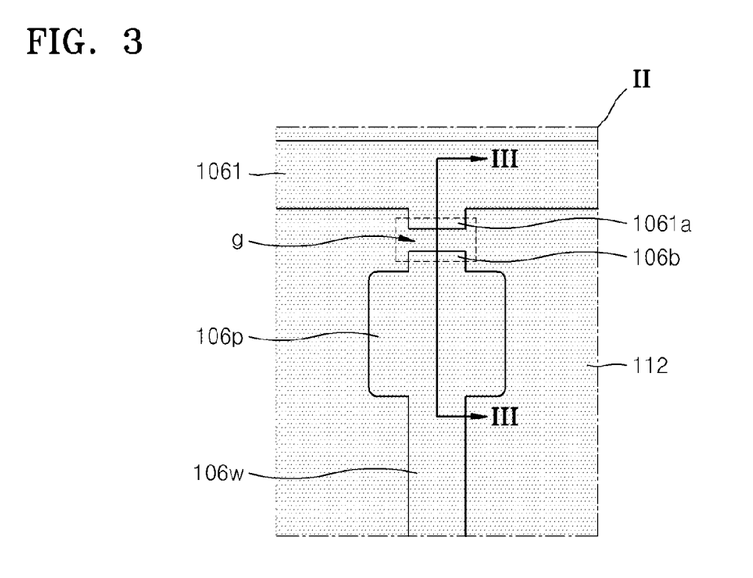
FIG. 3 is an enlarged top view (or enlarged plan view) of a part II indicated in FIG. 1.
Figure 4A:
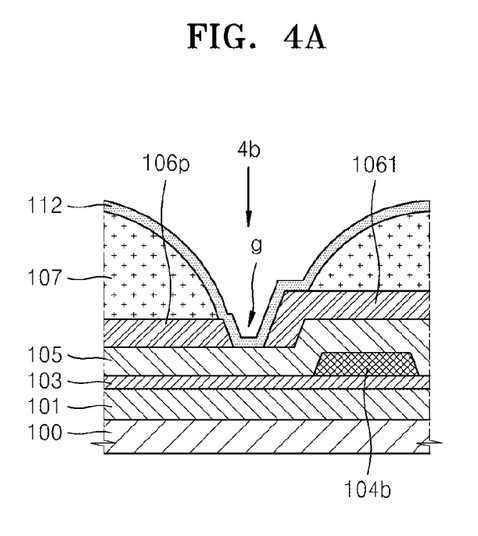
FIG. 4A is a cross-sectional view taken along a line III-III indicated in FIG. 3.
Figure 4B:
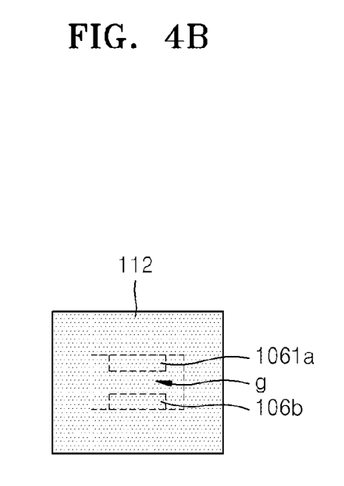
FIG. 4B is a partial top view (or partial plan view) seen from a direction indicated in FIG. 4A.

FIG. 3 is an enlarged top view illustrating a part II illustrated in FIG. 1. FIG. 4A is a cross-sectional view taken along a line III-III of FIG. 2, and FIG. 4B is a partial top view seen from a direction 4b indicated in FIG. 4A.

In an embodiment, the pixel wiring 106w is electrically connected to the first main wiring 1061 and may be indirectly connected to the first main wiring 1061. The pixel wiring 106w may be physically separated from the first main wiring 1061 by a gap g. The inspection pad 106p may be arranged at the end of the pixel wiring 106w, and the inspection pad 106p and the first main wiring 1061 may be physically separated from each other by the gap g.

A second bridge portion 106b may extend and/or protrude from the pixel wiring 106w and/or the inspection pad 106p and may be disposed closer to the first main wiring 1061 than any other portions of the pixel wiring 106w and/or the inspection pad 106p. A first bridge portion 1061a may protrude from one side of the first main wiring 1061 and may be disposed closer to the inspection pad 106p than any other portions of the first main wiring 1061. The first bridge portion 1061a and the first main wiring 1061 may be formed as a single body. The pixel wiring 106w, the inspection pad 106p, and the second bridge portion 106b may be formed as a single body. A width of the second bridge portion 106b may be substantially equal to a width of the pixel wiring 106w and may be smaller than a width of the inspection pad 106p, wherein the widths may be in the X-axis direction and/or may be perpendicular to the extension direction of the pixel wiring 106w. The first bridge portion 1061a and the second bridge portion 106b may contact each other through a common electrode 112, such that the pixel wiring 106w may be electrically connected through the inspection pad 106p, the second bridge portion 106b, the common electrode 112, and the first bridge portion 1061a to the first main wiring 1061.

A pixel definition layer 107 is provided on the pixel wiring 106w, the inspection pad 106p, and the first main wiring 1061. The pixel definition layer 107 is formed of an insulating material, may have a single layer structure or a multilayer structure, and may include one or more organic and/or one or more inorganic materials. An opening is provided in the pixel definition layer 107 and exposes at least the first bridge portion 1061a and the second bridge portion 106b. Although the common electrode 112 and other wirings may be insulated by the pixel definition layer 107, the opening allows the common electrode 112 to be electrically connected to each of the pixel wiring 106w and the first main wiring 1061.

The common electrode 112 substantially covers the entire substrate 100. The common electrode 112 covers the display area DA and the peripheral area PA. In the peripheral area PA, the first bridge portion 1061a and the second bridge portion 106b are exposed by the opening. The common electrode 112 is formed of a conductive material.

In an embodiment, the pixel wiring 106w, the inspection pad 106p, the first bridge portion 1061a, the second bridge portion 106b, and the first main wiring 1061 may be provided on the same layer and may be formed of a same conductive material. For example, the pixel wiring 106w, the inspection pad 106p, the first bridge portion 1061a, the second bridge portion 106b, and the first main wiring 1061 may be provided on an interlayer dielectric 105. The pixel wiring 106w, the inspection pad 106p, the first bridge portion 1061a, the second bridge portion 106b, and the first main wiring 1061 may be insulated from a gate wiring 104b by the interlayer dielectric 105.

As illustrated in FIG. 4A, the pixel wiring 106w, the inspection pad 106p, the first bridge portion 1061a, the second bridge portion 106b, and the first main wiring 1061 may be provided on a gate insulating layer 103. The gap g may be wider than at least the thickness of the gate insulating layer 103. The interlayer dielectric 105 may be provided between the gate insulating layer and the wirings. In an embodiment, the interlayer dielectric 105 may have an opening that is connected to the opening of the pixel definition layer such that the first bridge portion 1061 and the second bridge portion 106b are in direct contact with the common electrode 112.

In an embodiment, since the inspection pad 106p and the first main wiring 1061 are not in direct contact with each other, it is possible to detect open or short defects of the pixel wiring 106w by applying an additional inspection signal to the inspection pad 106p.

If the pixel wiring 106w and the inspection pad 106p are formed together with the first main wiring 1061 as a single body, a top end of the pixel wiring 106w is directly connected to the first main wiring 1061 and a bottom end of the pixel wiring 106w is directly connected to the second main wiring 1062. Since clamped voltages of the first main wiring 1061 and the second main wiring 1062 may substantially influence the waveform of the inspection signal received by the inspection pad 106, errors may occur in determining whether the waveform of an output signal is normal. As a result, errors may occur in the inspection process.

In an embodiment, the pixel wiring 106w and the inspection pad 106p are electrically insulated from the first main wiring 1061 when inspection of the pixel wiring 106w is performed. Advantageously, clamped voltages may be substantially prevented, and substantially accurate inspection may be performed. After the inspection has been completed, the common electrode 112 may be formed both for function as an electrode of a light-emitting element and for electrically connecting the first main wiring 1061 and the pixel wiring 106w. Advantageously, the inspection may be performed with satisfactory accuracy without requiring additional processes or elements for electrically connecting the first main wiring 1061 and the pixel wiring 106w.

Figure 5A:
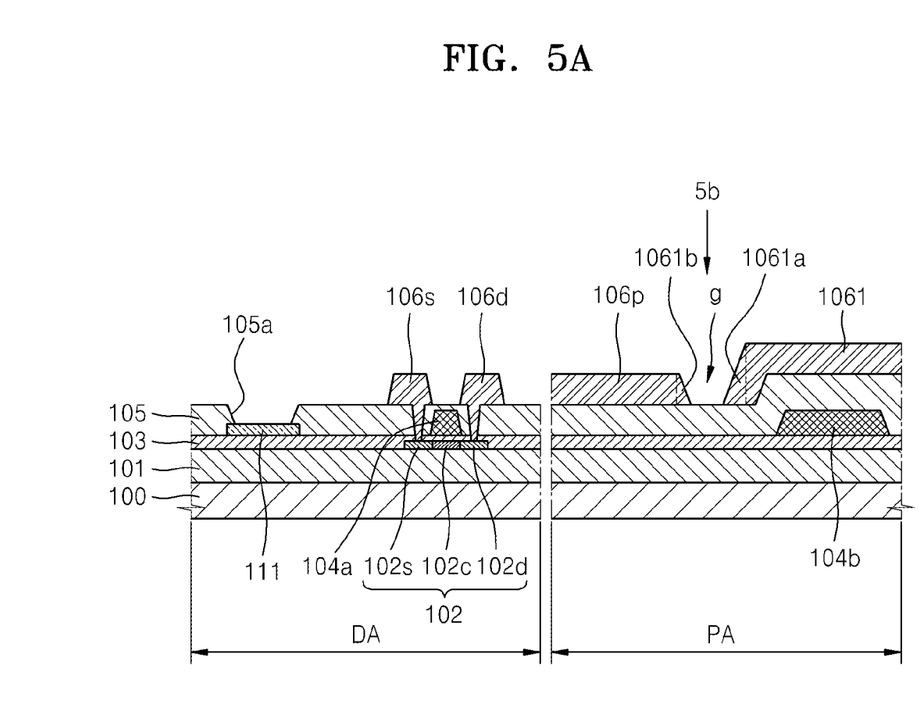
Figure 5B:
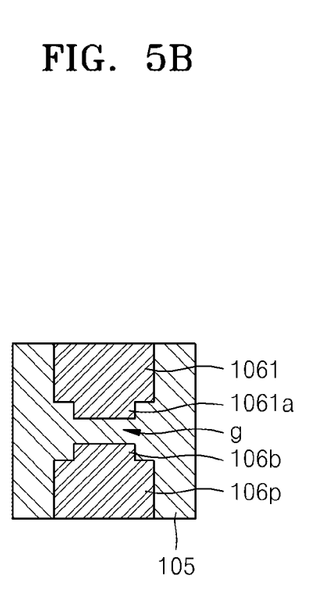
Figure 6A:
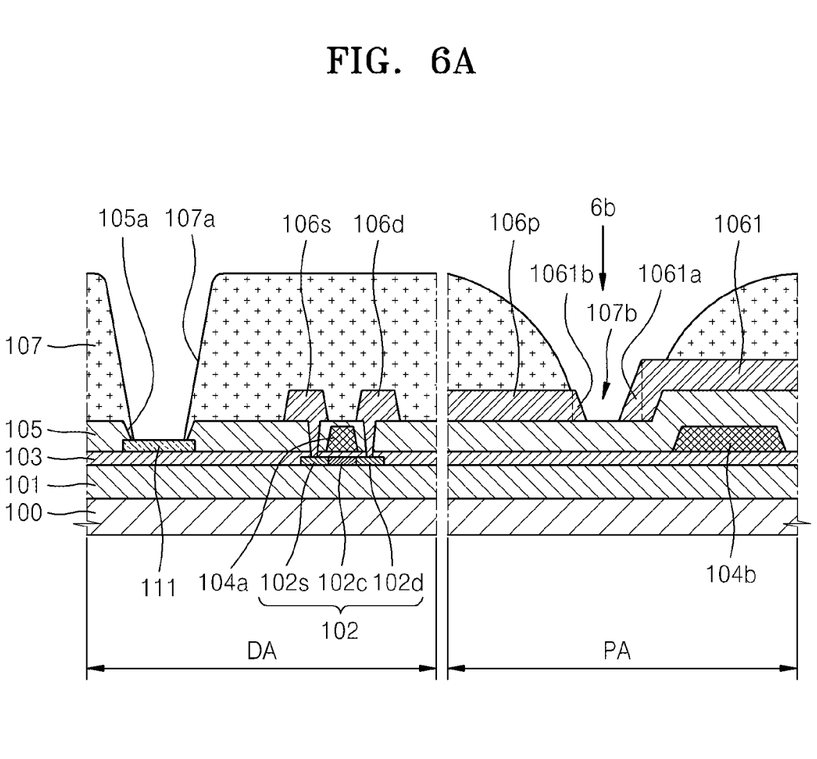
Figure 6B:
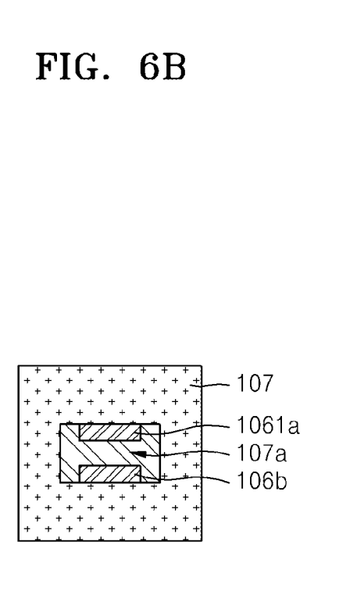
Figure 7A:
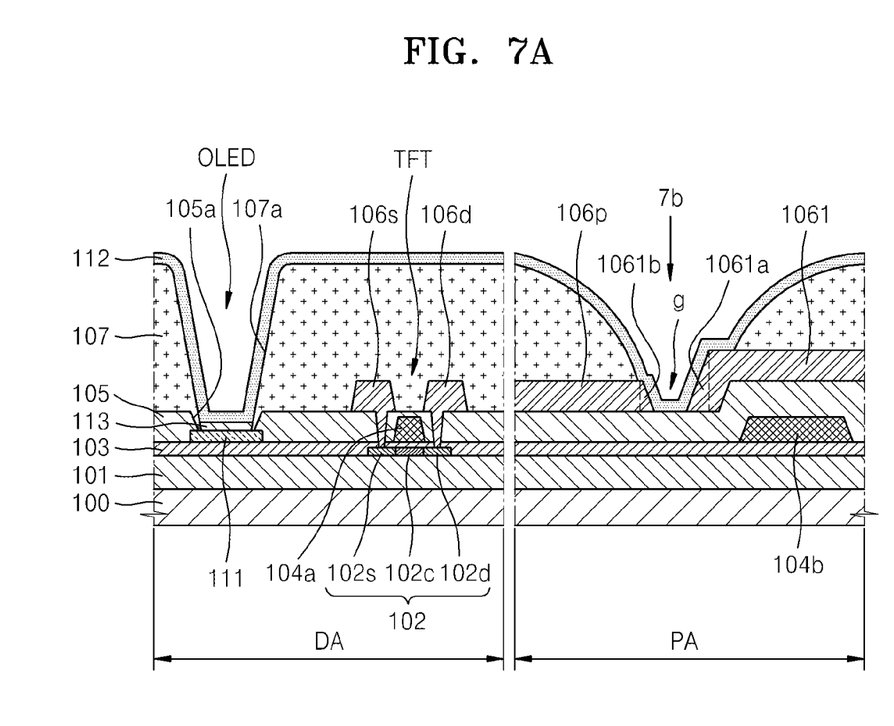
Figure 7B:
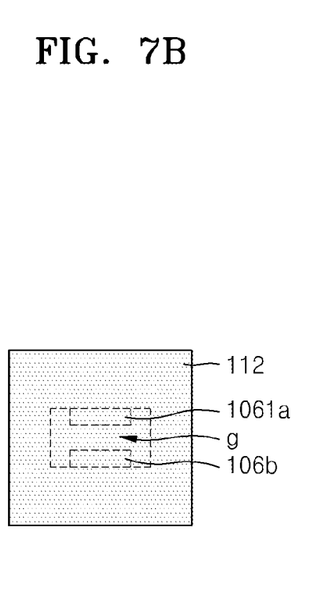

FIGS. 5A to 7B are schematic cross-sectional views illustrating a method for manufacturing the flat panel display device 10. FIGS. 5A, 6A, and 7A illustrate cross-sectional views related to a thin film transistor TFT and an organic light emitting display (OLED) apparatus included in the display area DA; FIGS. 5A, 6A, and 7A further illustrate cross-sectional views related to a part taken along the line III-III indicated in FIG. 3 and included in the peripheral area PA. FIGS. 5B, 6B, and 7B illustrate partial top views from directions of 5b, 6b, and 7b, respectively.

Referring to FIG. 5A, the substrate 100 is prepared. The substrate 100 may support the entire flat panel display device 10. The substrate 100 may be formed of a transparent insulating material having a flat top surface. The substrate 100 may be formed of or formed from one or more of glass, a plastic material such as polyethersulphone (PES) and polyacrylate (PAR), an opaque material such as a metal, and a carbon fiber. In an embodiment, the flat panel display device 10 is flexible, and the substrate 100 may be formed of a plastic material having flexibility, for example, a polyimide (PI) film.

A buffer layer 101 is formed on the substrate 100. The buffer layer 101 has a smooth top surface and may prevent penetration of impurities. The buffer layer 101 may have a multilayer structure or a single-layer structure. The buffer layer 101 may include a film that is formed of an inorganic material such as silicon oxide (SiOx) and/or silicon nitride (SiNx). The buffer layer 101 may be formed using one or more of various vapor-deposition methods. The buffer layer 101 may be omitted in an embodiment.

A pixel circuit is formed on the buffer layer 101 corresponding to the display area DA. FIGS. 5A, 6A, and 7A illustrate one TFT and one OLED included in the pixel circuit illustrated in FIG. 2.

As shown in the drawings, the TFT may be of a top gate type. The TFT may include an active layer 102, a gate electrode 104a, a source electrode 106s, and a drain electrode 106d. In an embodiment, the TFT may be of one or more of other types, such as a bottom gate type.

The active layer 102 is formed on the buffer layer 101. The active layer 102 may include a semiconductor material such as one or more of amorphous silicon and poly crystalline silicon. In an embodiment, the active layer 102 may include an oxide semiconductor material such as indium gallium zinc oxide (GIZO). The active layer 102, in addition to or alternative to GIZO, may include one or more oxides of one or more of metallic materials in one or more of groups 12, 13, and 14 of the periodic table, such as Zn, In, Ga, Sn, Cd, Ge, and Hf. The active layer 102 includes a source area 102s, a drain area 102d, and a channel area 102c located therebetween. The source area 102s and the drain area 102d are respectively in direct contact with the source electrode 106s and the drain electrode 106d. In an embodiment, the active layer 102 includes at least one of amorphous silicon and poly crystalline silicon, and each of the source area 102s and the drain area 102d may be doped with impurities.

The gate insulating layer 103 is formed on the active layer 102. The gate insulating layer 103 may have a single-layer structure or a multilayer structure. The gate insulating layer may include a layer formed of an inorganic material, such as silicon oxide and/or silicon nitride. The gate insulating layer 103 electrically insulates the active layer 102 from the gate electrode 104a.

The gate wiring 104b and a gate electrode 104a are formed on the gate insulating layer 103. The gate electrode 104a is electrically connected to the gate wiring 104b for applying on/off signals to the TFT. The gate electrode 104a may be formed of a low-resistance metallic material. The gate electrode 104a may have a multilayer structure or a single-layer structure. The gate insulating layer 103 may include a film formed of a conductive material including, for example, one or more of Mo, Al, Cu, and Ti.

The OLED is formed on the gate insulating layer 103. The OLED includes a lower electrode 111 (or pixel electrode 111) formed on the gate insulating layer 103, a common electrode 112 overlapping the lower electrode 111 (and overlapping other pixel electrodes that are associated with other pixels), and an intermediate layer 113 interposed between the lower electrode 111 and the common electrode 112. Depending on an emission direction of the OLED, the flat panel display device 10 may be of a bottom emission type, a top emission type, and/or a dual emission type. In the bottom emission type, the lower electrode 111 is provided as a light transmission electrode and the common electrode 112 is provided as a reflective electrode. In the top emission type, the lower electrode 111 is provided as a reflective electrode and the common electrode 112 is provided as a transflective electrode. In the dual emission type, both the lower electrode 111 and the common electrode 112 are provided as light transmission electrodes.

The lower electrode 111 may function as an anode and may include at least one of Indium tin oxide (ITO), indium zinc oxide (IZO), zinc oxide (ZO), indium oxide ($In_2O_3$), indium gallium oxide (IGO), and aluminum zinc oxide (AZO).

The lower electrode 111 may be patterned to correspond to one pixel and to be separate from other lower electrodes that correspond to other pixels. The lower electrode 111 may be electrically connected to the drain electrode 106d of the TFT to receive a current therefrom.

An interlayer dielectric 105 is formed on the gate electrode 104a. The interlayer dielectric 105 electrically insulates the source electrode 106s, the drain electrode 106d, and the gate electrode 104a from one another. The interlayer dielectric 105 may have a single-layer structure or a multilayer structure. The interlayer dielectric 105 may include a film that is formed of an inorganic material. For example, the inorganic material may be one of a metallic oxide and a metallic nitride. In an embodiment, the inorganic material may include one or more of $SiO_2$, SiNx, SiON, $Al_2O_3$, $TiO_2$, $Ta_2O_5$, $HfO_2$, and $ZrO_2$.

The interlayer dielectric 105 may include a first opening 105a exposing the lower electrode 111 of the OLED and may include contact holes exposing parts of the active layer 102.

The source electrode 106s, the drain electrode 106d, the pixel wiring 106w, the inspection pad 106p, the first bridge portion 1061a, the second bridge portion 106b, and the first main wiring 1061 are formed on the interlayer dielectric 105. The source electrode 106s, the drain electrode 106d, the pixel wiring 106w, the inspection pad 106p, the first bridge portion 1061a, the second bridge portion 106b, and the first main wiring 1061 may be simultaneously formed on the same layer in the same process using the same type of material. The second main wiring 1062 may also be formed during this same process.

The source electrode 106s and the drain electrode 106d are in direct contact with the source area 102s and the drain area 102d, respectively, of the active layer 102 through the contact holes formed through the interlayer dielectric 105 and the gate insulating layer 103. In an embodiment, the TFT shown in FIG. 5A may represent the third transistor TC3 illustrated in FIG. 2, and one of the source electrode 106s and the drain electrode 106d may be electrically connected to the pixel wiring 106w. The pixel wiring 106w and the inspection pad 106p are formed to be separated from the first main wiring 1061 with the certain gap g. In an embodiment, the first bridge portion 1061a and the second bridge portion 106b are separated from each other by the gap g. That is, the inspection pad 106p is electrically insulated from the first main wiring 1061 in the structure illustrated in FIG. 5A and FIG. 5B.

With the structure illustrated in FIG. 5A and FIG. 5B, wherein the inspection pad 106p is electrically insulated from the first main wiring 1061, the pixel wiring 106w may be inspected for possible open or short defects.

To detect possible defects of the pixel wiring 106w, an inspection signal having a certain waveform is applied to the inspection pad 106p, which is connected to the pixel wiring 106w. Whether open or short defects occur in the wirings may be determined based on whether an output signal has a proper waveform. In the structure illustrated in FIG. 5, since the inspection pad 106p is insulated from the first main wiring 1061, the inspection signal may not be affected by any clamped voltages, and the inspection result may be substantially accurate. If a defect is identified as a result of the inspection, an operation for repairing the defect may be performed. If no defect is detected or if identified defects have been repaired, the manufacturing of the flat panel display device 10 may proceed to the step illustrated in FIG. 6A and FIG. 6B. Referring to FIG. 6A, a pixel definition layer 107 is formed on substantially the entire substrate 100. The pixel definition layer 107 entirely covers the source electrode 106s, the drain electrode 106d, the pixel wiring 106w, the inspection pad 106p, and the first main wiring 1061. The pixel definition layer 107 may have a single-layer structure or a multilayer structure. The pixel definition layer 107 may include a film formed of an inorganic material and/or an organic material. For example, the inorganic material may include a metallic oxide and/or a metallic nitride, and the organic material may include at least one of a polyimide, polyamide, an acrylic resin, benzocyclobutene, and a phenol resin.

Next, a second opening 107a, which may define an emission area by exposing the lower electrode 111, is formed through the pixel definition layer 107 in the display area DA. The first opening 105a is connected to the second opening 107a. In an embodiment, a portion of the pixel definition layer 107 and a portion of the second opening 107a may be disposed inside the first opening 105a. Subsequently, the intermediate layer 113 is formed in at least an area defined by the second opening 107a.

The intermediate layer 113 may include an organic emissive layer configured for emitting one or more of red, green, and blue lights. The organic emissive layer may include at least one of a low-molecular organic material and a high-molecular organic material. In an embodiment, the organic emissive layer is a low-molecular organic layer formed of a low-molecular organic material, a hole transport layer HTL and a hole injection layer HIL are located in a space toward the lower electrode 111, and an electron transport layer ETL and an electron injection layer EIL are stacked toward the common electrode 112. In an embodiment, the intermediate layer 113 may include additional layers in addition to the hole injection layer, the hole transport layer, the electron transport layer, and the electron injection layer.

In an embodiment, an individual organic emissive layer is formed for each pixel. In an embodiment, individual pixels may emit red, green, and blue lights, and a pixel group configured for emitting red, green, and blue lights may form one unit pixel. In an embodiment, an organic emissive layer may be commonly formed in one unit pixel. In an embodiment, a plurality of organic emissive layers configured for emitting red, green, and blue lights may be stacked or mixed perpendicularly, for emitting white light. In an embodiment, a color transformation layer or a color filter for converting emitted white light into a certain color may be used in the display device 10.

A third opening 107b is formed in the pixel definition layer 107 in the peripheral area PA. The third opening 107b exposes at least the first bridge portion 1061a and the second bridge portion 106b.

Next, referring to FIG. 7A and FIG. 7B, the common electrode 112 is formed on substantially the entire substrate 100. The common electrode 112 may be formed to extend over the entire display area (where an image is provided) and the peripheral area PA. In an embodiment, the common electrode 112 may be formed using an evaporation process that does not damage the intermediate layer 113. The common electrode 112 may be formed of a conductive inorganic material. In an embodiment, the common electrode 112 may function as a cathode and may be formed of one at least one of Li, Ca, LiF/Ca, LiF/Al, Al, Mg, and Ag.

The polarity of the lower electrode 111 may be opposite to the polarity of the common electrode 112.

In an embodiment, the common electrode 112 is in direct contact with the first bridge portion 1061a and the second bridge portion 106b, which are exposed through the third opening 107b. Accordingly, the first main wiring 1061 and the inspection pad 106p are electrically connected to each other through the common electrode 112.

As described above, in the present embodiment, the first main wiring 1061 and the second main wiring 1062 are connected to the pixel wiring 106w in such a way that a substantially uniform initialization voltage may be applied to the entire display area DA, thereby increasing a black margin, preventing the occurrence of a Mura defect, and increasing LRU.

In an embodiment, open and short defects of the pixel wiring 106w may be substantially accurately detected using an inspection signal when the structure is manufactured. This is because the pixel wiring 106w and the inspection pad 106p are electrically insulated from the first main wiring 1061 when the inspection is performed.

In an embodiment, after forming the common electrode 112, to protect the common electrode 112, a capping layer (not shown) formed of an insulating material may be further formed on the common electrode 112.

In an embodiment, to seal the OLED and to protect the display area DA, at least one of a thin film encapsulation structure and an encapsulation substrate may be further formed.

While the present invention has been particularly illustrated and described with reference to embodiments thereof, it will be understood by those of ordinary skill in the art that various changes in form and details may be made therein without departing from the spirit and scope of the present invention as defined by the following claims.

What is claimed is:

1. A method for manufacturing a flat panel display device, the method comprising:
   forming a pixel circuit, a pixel wiring connected to the pixel circuit, an inspection pad connected to the pixel wiring, and a main wiring separated from the inspection pad by a gap;
   inspecting whether the pixel wiring has a defect or not by applying an inspection signal to the inspection pad; and
   after the inspecting, forming a common electrode covering at least two pixel electrodes of the flat panel display device and electrically connecting the inspection pad to the main wiring.

2. The method of claim 1, wherein the pixel wiring, the inspection pad, and the main wiring are formed simultaneously.

3. The method of claim 1, wherein the forming of the inspection pad and the main wiring comprises simultaneously forming a first bridge portion protruding from a side of the main wiring that faces the inspection pad and forming a second bridge portion protruding from a side of the inspection pad that faces the main wiring, and
   wherein, in the forming of the common electrode, the common electrode electrically connects the first bridge portion and the second bridge portion to each other.

4. The method of claim 3, further comprising:
   after the inspecting, forming an insulating layer that covers the inspection pad and the main wiring; and
   forming an opening in the insulating layer, the opening exposing the first bridge portion and the second bridge portion.

5. The method of claim 4, wherein, in the forming of the common electrode, the common electrode is provided on the insulating layer and is in direct contact with the first bridge portion and the second bridge portion exposed through the opening.

6. A flat panel display device comprising:
   a pixel circuit provided on a substrate;
   a pixel wiring;
   an inspection pad connected to the pixel circuit through the pixel wiring;
   a main wiring separated from the inspection pad by a gap; and
   a common electrode covering substantially the entire substrate and electrically connecting the inspection pad to the main wiring.

7. The flat panel display device of claim 6, wherein the main wiring extends in a first direction, and
   wherein the pixel wiring extends in a second direction that is different from the first direction.

8. The flat panel display device of claim 6, further comprising:
   a gate wiring provided on the substrate; and
   an insulating layer covering the gate wiring,
   wherein the main wiring and the inspection pad are formed on the insulating layer.

9. The flat panel display device of claim 6, wherein the main wiring is configured to apply an initialization voltage to the pixel circuit.

10. The flat panel display device of claim 6, wherein the pixel circuit comprises a capacitor, and
    wherein the pixel wiring is connected to the capacitor.

11. The flat panel display device of claim 6, further comprising:
    a first bridge portion protruding from a side of the main wiring that faces the inspection pad; and
    a second bridge portion protruding from a side of the inspection pad that faces the main wiring,
    wherein the common electrode electrically connects the first bridge portion to the second bridge portion.

12. The flat panel display device of claim 11, further comprising an insulating layer that covers the inspection pad and the main wiring,
    wherein the insulating layer has an opening that exposes the first bridge portion and the second bride portion.

13. The flat panel display device of claim 12, wherein the common electrode is provided on the insulating layer and is in direct contact with each of the first bridge portion and the second bridge portion exposed through the opening.

14. The flat panel display device of claim 6, wherein the substrate comprises a first edge and a second edge substantially parallel to the first edge,
    wherein the main wiring comprises:
    a first main wiring arranged at the first edge; and
    a second main wiring arranged at the second edge, and
    wherein the pixel wiring is electrically connected to both the first main wiring and the second main wiring.

15. The flat panel display device of claim 14, wherein the pixel wiring is electrically connected to the first main wiring through the common electrode and is directly connected to the second main wiring.

16. A display device comprising:
    a pixel circuit included in a first pixel of the flat panel display device;
    a pixel wiring;
    an inspection pad electrically connected through the pixel wiring to the pixel circuit;
    a main wiring separated from the inspection pad by a gap;
    a first pixel electrode associated with the first pixel of the display device;
    a second pixel electrode associated with a second pixel of the display device; and
    a common electrode overlapping both the first pixel electrode the second pixel electrode and being electrically connected to both the inspection pad and the main wiring.

17. The display device of claim 16, wherein a portion of the common electrode is disposed between the inspection pad and the main wiring.

18. The display device of claim 16, further comprising a dielectric layer that directly contacts each of the inspection pad, the main wiring, and the common electrode.

* * * * *